US007139671B2

(12) United States Patent  
Satake

(10) Patent No.: US 7,139,671 B2
(45) Date of Patent: Nov. 21, 2006

(54) SEMICONDUCTOR DEVICE FABRICATION METHOD

(75) Inventor: Nobuo Satake, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 10/993,135

(22) Filed: Nov. 22, 2004

(65) Prior Publication Data
US 2006/0025956 A1    Feb. 2, 2006

(30) Foreign Application Priority Data
Jul. 27, 2004    (JP) .............................. 2004-219151

(51) Int. Cl.
*G06F 19/00* (2006.01)

(52) U.S. Cl. ...................... 702/118; 702/117; 702/182; 702/189; 700/121; 438/5; 438/10; 438/14; 324/500; 324/71.5; 714/25; 716/4; 716/8; 716/10

(58) Field of Classification Search ................ 702/118, 702/117, 182, 191, 189; 700/121; 438/5, 438/6, 10, 14–17; 324/500, 451, 71.5; 714/25; 716/4–5, 8, 10
See application file for complete search history.

(56) References Cited

U.S. PATENT DOCUMENTS

| 6,021,380 | A  | * | 2/2000 | Fredriksen et al. ............ 702/35 |
| 6,210,983 | B1 | * | 4/2001 | Atchison et al. .............. 438/14 |
| 6,349,240 | B1 | * | 2/2002 | Ogawa et al. .............. 700/121 |
| 6,911,350 | B1 | * | 6/2005 | Tsidilkovski et al. ......... 438/17 |
| 6,927,078 | B1 | * | 8/2005 | Saijyo et al. ................ 438/10 |

FOREIGN PATENT DOCUMENTS

JP    61-237443    10/1986

(Continued)

OTHER PUBLICATIONS

Wong, 'A Statistical Approach to Identify Semiconductor Process Equipment Related Yield Problems', 1997, IEEE Publication, pp. 69-73.*

(Continued)

*Primary Examiner*—Marc S. Hoff
*Assistant Examiner*—Elias Desta
(74) *Attorney, Agent, or Firm*—Westerman, Hattori, Daniels & Adrian, LLP

(57) ABSTRACT

A semiconductor device fabrication method comprises; a first step S1 of fabricating a plurality of semiconductor chips on a plurality of semiconductor wafers, respectively; a second step S4 of making a probe test on the plural semiconductor chips respectively, which are present in a sampling region of one semiconductor wafer of the plural semiconductor wafers; and the third step S5 of computing a yield of the plural semiconductor chips present in the sampling region, when the yields of the plural semiconductor chips computed in the third step are a reference value or above, the probe test is not made on the plural semiconductor chips, which are present outside the sampling region of said one semiconductor wafer and on the rest semiconductor wafers of the plural semiconductor wafers fabricated in the same lot as said one semiconductor wafer. The probe test is made on the plural semiconductor chips respectively, which are present in the sampling region of said one semiconductor wafer of the plural semiconductor wafers, and when the yield of the semiconductor chips present in the sampling region is the reference value or above, the probe test is not made on the rest semiconductor chips present in the rest region of said one semiconductor wafer other than the sampling region and on the rest semiconductor wafers fabricated in the same lot as said one semiconductor wafer, whereby the inspection period of time can be drastically shortened.

20 Claims, 9 Drawing Sheets

FOREIGN PATENT DOCUMENTS

JP          10-242224          9/1998

OTHER PUBLICATIONS

Wong, 'A Statistical Parameteric and Probe Yield Analysis Methodology', 1996, IEEE Publication, pp. 131-139.*

Barnett et al., 'Relating Yield Models to Burn-In Fall-Out in Time', 2003, IEEE Publicaiton, pp. 77-84.*

Hamamura et al., 'An Advanced Defect-Monitoring Test Structure for Electrical Screening and Defect Localization', May 2004, IEEE Publication, vol. 17, No. 2, pp. 104-110.*

Dowsett, 'The Application of Surface Analytical Techniques to Silicon Technology', Feb. 1991, Fresenius J A. Chemistry Publication, No. 341, pp. 224-234.*

* cited by examiner

SEMICONDUCTOR DEVICE FABRICATION METHOD

CROSS-REFERENCE TO RELATED APPLICATION

This application is based upon and claims priority of Japanese Patent Application No. 2004-219151, filed on Jul. 27, 2004, the contents being incorporated herein by reference.

BACKGROUND OF THE INVENTION

The present invention relates to a semiconductor device fabrication method, more specifically a semiconductor device fabrication method which can improve the inspection efficiency.

When semiconductor chips are completed on a semiconductor wafer, the inspection is made for confirming whether or not the semiconductor chips normally operate. Such inspection is called a probe test. The probe test is made by connecting to the bonding pads of the semiconductor chips with the probe needle which is connected to a semiconductor inspection equipment.

The probe test has been made on all the semiconductor chips so as to prevent the yield decrease in the final test made after semiconductor devices have been fabricated.

Recently, large-diameter semiconductor wafers of 8–12 inch-diameters are becoming dominant. When relatively small semiconductor chips of, e.g., about 2.5 mm×2,5 mm are fabricated on such large-diameter semiconductor wafer, 5000 or more semiconductor chips are fabricated on one sheet of semiconductor wafer.

When a period of time for the probe test per one chip is 3 seconds, about 4.1 hours are required to inspect one sheet of semiconductor wafer. For 1 lot of 25 sheets of semiconductor wafers, 4.3 days are required to inspect the semiconductor wafers of 1 lot.

To realize the cost reduction of semiconductor devices, it is very important to shorten the time required for the probe test.

Patent References 1 and 2 propose methods for shortening the time required for the probe test.

[Patent Reference 1]
Specification of Japanese Patent Application Unexamined Publication No. Hei 10-242224/1998

[Patent Reference 2]
Specification of Japanese Patent Application Unexamined Publication No. Sho 61-237443/1986

However, the methods described in Patent References 1 and 2 have not been able to drastically shorten the time required for the probe test.

SUMMARY OF THE INVENTION

An object of the present invention is to provide a semiconductor device fabrication method which can drastically shorten the inspection period of time.

According to one aspect of the present invention, the present invention provides a semiconductor device fabrication method comprising; a first step of fabricating a plurality of semiconductor chips on a plurality of semiconductor wafers, respectively; a second step of making a probe test on the plural semiconductor chips respectively, which are present in a sampling region of one semiconductor wafer of the plural semiconductor wafers; and a third step of computing a yield of the plural semiconductor chips present in the sampling region, when the yield of the plural semiconductor chips computed in the third step are a reference value or above, the probe test being not made on the plural semiconductor chips, which are present outside the sampling region of said one semiconductor wafer and on the rest semiconductor wafers of the plural semiconductor wafers fabricated in the same lot as said one semiconductor wafer.

According to the present invention, the probe test is made on a plurality of semiconductor chips respectively, which are present in a sampling region of one semiconductor wafer of a plurality of semiconductor wafers, and when a yield of the semiconductor chips present in the sampling region is a reference value or above, the probe test is not made on the rest semiconductor chips present in the rest region of the semiconductor wafer other than the sampling region and on the rest semiconductor wafers fabricated in the same lot as the semiconductor wafer, whereby the inspection period of time can be drastically shortened.

DETAILED DESCRIPTION OF THE INVENTION

[An Embodiment]

Figure 1:
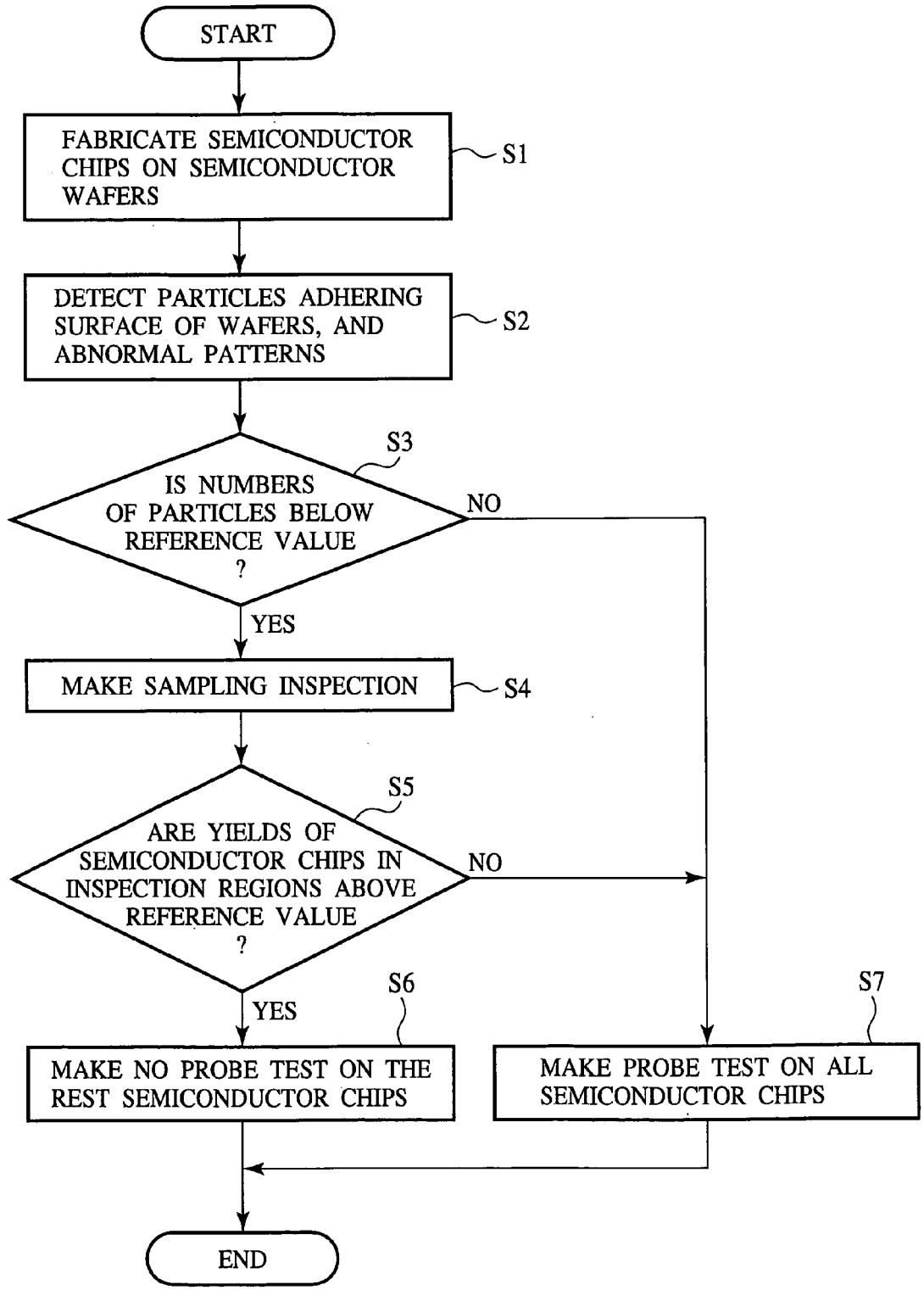
FIG. 1 is a flow chart of the semiconductor device fabrication method according to one embodiment of the present invention.

The semiconductor device fabrication method according to an embodiment of the present invention will be explained with reference to FIGS. 1 to 8. FIG. 1 is the flow chart of the semiconductor device fabrication method according to the present embodiment.

First, prerequisites for applying the semiconductor device fabrication method according to the present embodiment will be explained.

The prerequisites for the application of the semiconductor device fabrication method according to the present embodiment are that the process for fabricating semiconductor chips is very stable, the average value m of fabrication yields of the semiconductor chips in prescribed sampling regions (inspection regions) of semiconductor wafers given by the inspection is, e.g., very high, and dispersion of the fabrication yields of the semiconductor chips in the prescribed sampling regions of the semiconductor wafers given by the inspection, i.e., the standard deviation σ of the fabrication yields of the semiconductor chips is very small. The semiconductor device fabrication method according to the present embodiment is applied to, e.g., the case that a semiconductor device having a 95% or above average fabrication yield m and a 2% or below standard deviation σ of the semiconductor chips in a prescribed sampling region. When the value of m is 95%, and the value of σ is 2%, (m−2σ) is 91%. It is unpreferable to apply the present invention to semiconductor devices having values of (m−2σ) lower than, e.g., 90%, because the yield will be possibly lowered and lower than the break-even point in the final test.

Even with a relatively high average value m of fabrication yields of semiconductor chips, when the standard deviation σ of the fabrication yields of the semiconductor chips is relatively high, many defective semiconductor devices are detected in the final test (FT) made after the semiconductor devices have been fabricated, which even increases the fabrication cost. Thus, it is important that the average value m of fabrication yields of semiconductor chips of the semiconductor wafers is very high, and also the standard deviation σ of fabrication yields of the semiconductor chips of the semiconductor wafers is very small.

Next, the semiconductor device fabrication method according to the present embodiment will be explained with reference to FIGS. 1 to 8.

First, a plurality of semiconductor chips are fabricated on a semiconductor wafer (Step S1). The number of semiconductor wafers of 1 lot in fabricating semiconductor devices is, e.g., 48 sheets.

Next, on the semiconductor wafers of 1 lot, the detection of particles adhering to the surfaces of the semiconductor wafers is made (Step S2). In detecting particles adhering to the surfaces of the semiconductor wafers, a surface particle detector by KLA-Tencor Corporation, for example, is used. At this time, it is also inspected whether or not abnormal patterns are present. Then, it is judged whether or not numbers of the particles adhering to the surfaces of the semiconductor wafers are a prescribed value or below (Step S3).

Next, those of the semiconductor wafers whose numbers of particles adhering to the surfaces are smaller than a prescribed value are sampled for the inspection (Step S4). When 1 lot contains 48 sheets of semiconductor wafers, for example, the semiconductor wafer whose wafer number is 1, the semiconductor wafer whose wafer number is 11, the semiconductor wafer whose wafer number is 21, the semiconductor wafer whose wafer number is 31 and the semiconductor wafer whose wafer number is 41 are sampled for the inspection. In the sampling inspection, the probe test (PT) is made on a plurality of semiconductor chips fabricated in a prescribed sampling region. The probe test is an inspection for confirming whether or not semiconductor chips completed on a semiconductor wafer are normally operable. Probe needles connected to a semiconductor inspection equipment is connected to the bonding pads of semiconductor chips to thereby make the probe test.

Figure 2:
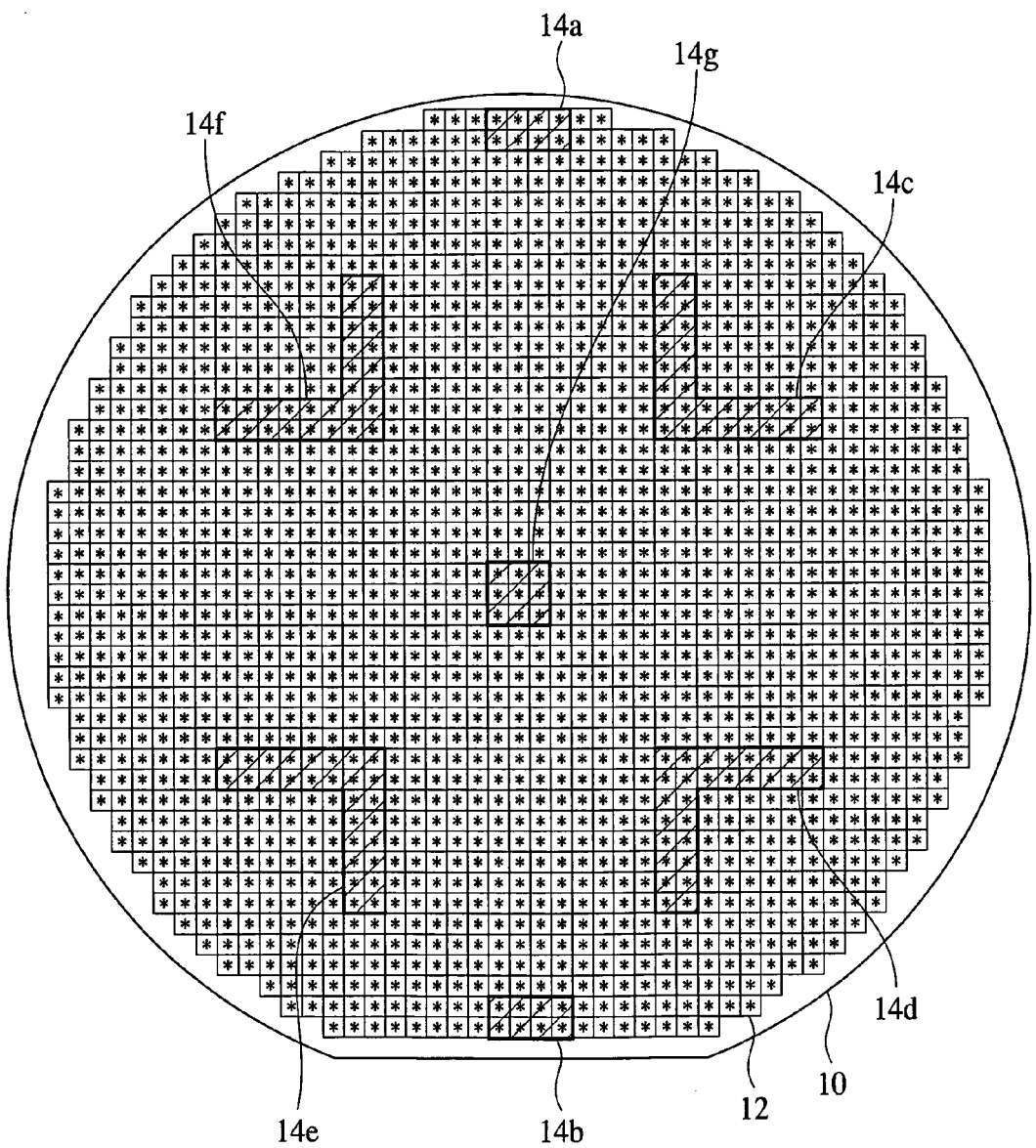
FIG. 2 is a plan view of a sampling region for sampling inspection.

FIG. 2 is a plan view of a sampling region for the sampling inspection.

As illustrated in FIG. 2, a large number of semiconductor chips 12 are fabricated on a semiconductor wafer 10. In FIG. 2, the semiconductor chips 12 are indicated by the mark *.

The sampling region includes partial regions 14*a*, 14*b* in the peripheral part of the semiconductor wafer 10, partial regions 14*c*–14*f* between the peripheral part and the central part of the semiconductor wafer 10, and a partial region 14*g* in the central part of the semiconductor wafer 10.

In the partial region 14*a* positioned at the upper part of the semiconductor wafer 10 as viewed in the drawing, for example, eight semiconductor chips 14 are fabricated. In the partial region 14*b* positioned at the lower part of the semiconductor wafer 10 as viewed in the drawing, for example, eight semiconductor chips 14 are fabricated.

The partial regions 14*c*–14*f* are formed in an L-shape. In the partial region 14*c* positioned in the first quadrant of the semiconductor wafer 10, for example, twenty-eight semiconductor chips 14 are fabricated. In the partial region 14*d* positioned in the second quadrant of the semiconductor wafer 10, for example, twenty-eight semiconductor chips 14 are fabricated. In the partial region 14*e* positioned in the third quadrant of the semiconductor wafer 10, for example, twenty-eight semiconductor chips 14 are fabricated. In the partial region 14*f* positioned in the fourth quadrant of the semiconductor wafer 10, for example, twenty-eight semiconductor chips 14 are fabricated.

Figure 3:
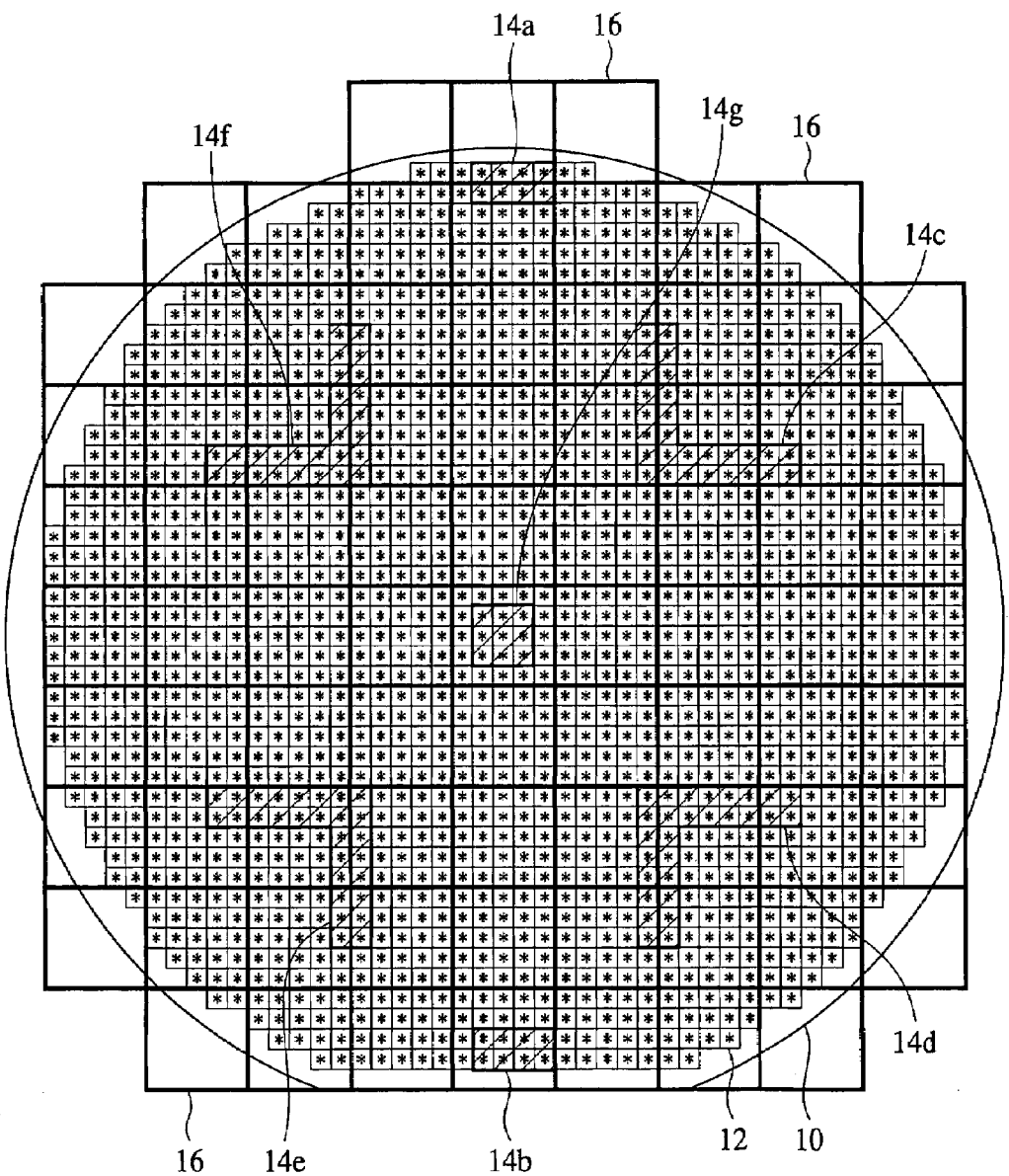
FIG. 3 is a plan view of the relationship between the sampling region and the one-shot exposure area of the exposures using a reticle.

FIG. 3 is a plan view illustrating the relationship between the sampling region and a one-shot exposed area of the exposure with a reticle.

On a reticle used in exposing the patterns of the semiconductor chips, patterns of, e.g., 5×5 semiconductor chips are fabricated. The respective L-shaped partial regions 14*c*–14*f* are arranged, containing edges of the 1-shot exposure area 16 of the exposure with the reticle. In other words, the respective L-shaped partial regions 14*c*–14*f* are arranged, containing regions where the patterns of the semiconductor chips positioned at the edge of the reticle is exposed.

The partial region 14*g* is positioned at the central part of the semiconductor wafer 10. Nine, for example, semiconductor chips 12 are fabricated in the partial region 14*g*.

The total number of the semiconductor chips 12 fabricated in the sampling region 14 containing the first partial regions 14*a*, 14*b*, the second partial regions 14*c*–14*f* and the third partial region 14*g* is, e.g., 137.

The sampling region 14 is set as illustrated in FIG. 2 and FIG. 3 for the following reason.

Figure 4:
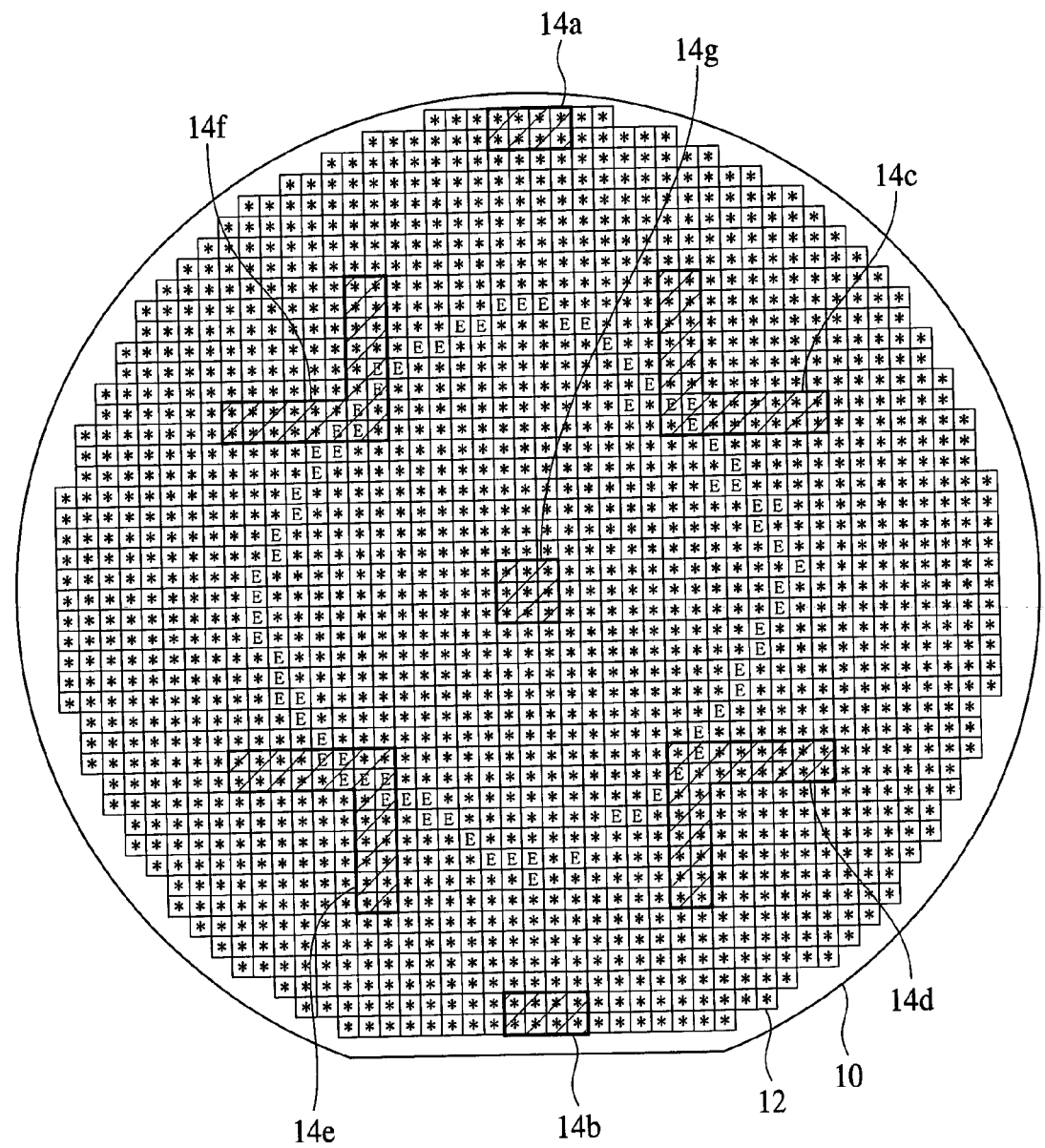
FIG. 4 is a plan view of a distribution of defects of the semiconductor chips (Part 1).

As exemplified in FIG. 4, there is a case that defective semiconductor chips 12 are distributed in a ring shape. FIG. 4 is a plan view of a distribution of defects semiconductor chips (Part 1). In FIG. 4, the defective semiconductor chips 12 are indicated by "E". Such distribution of the defective semiconductor chips 12 will be because an inter-layer insulation film (not illustrated) formed on the semiconductor wafer 10 is polished by CMP, and the film thickness is distributed in the ring-shape. Such defect manner is called here the defect mode A. When the defect mode A takes place, some of the semiconductor chips 12 present in the L-shaped sampling regions 14*c*–14*f* are judged defective.

Figure 5:
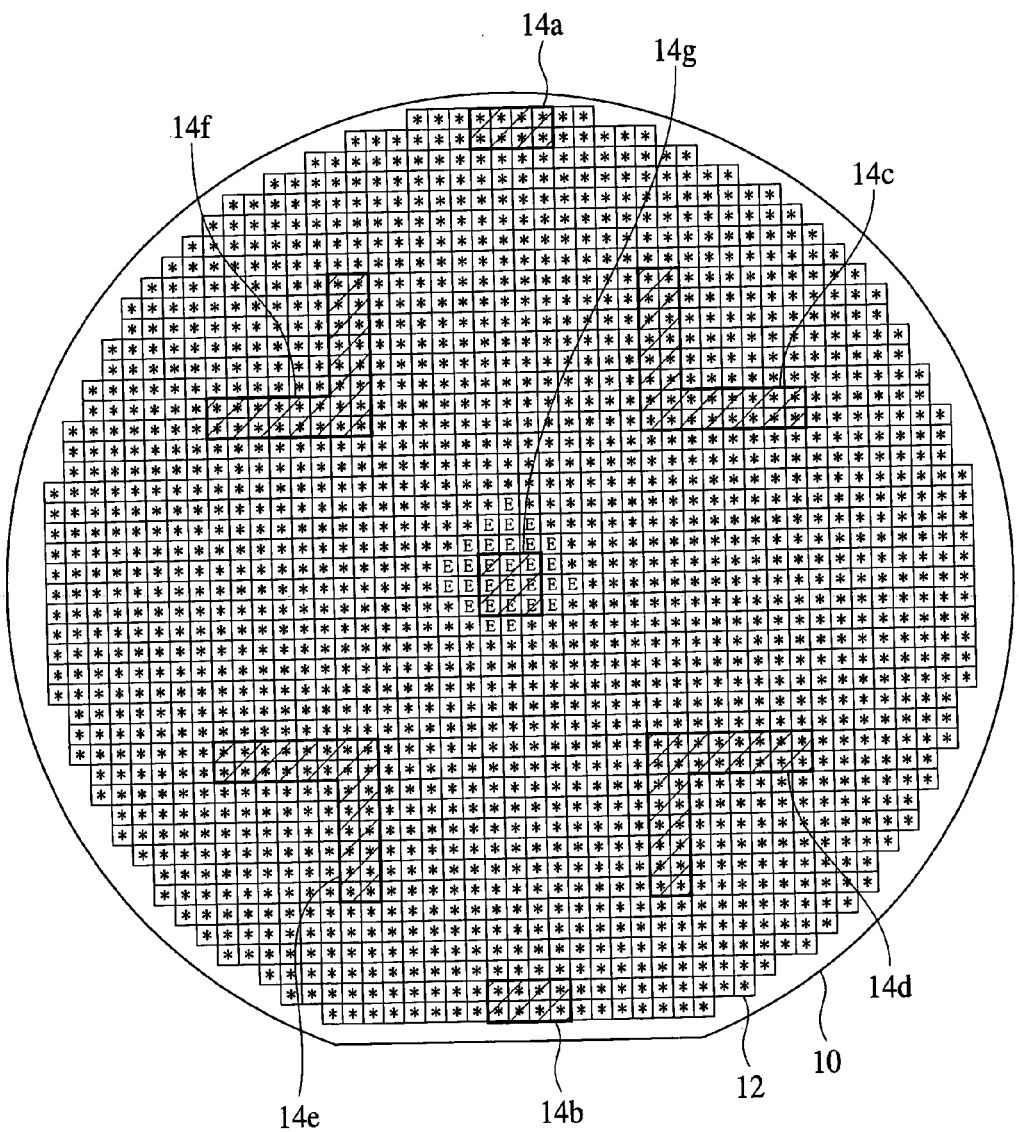
FIG. 5 is a plan view of a distribution of defects of the semiconductor chips (Part 2).

As illustrated in FIG. 5, there is a case that defective semiconductor chips 12 are concentrated on the central part of the semiconductor wafer 10. FIG. 5 is a plan view of a distribution of defects of semiconductor chips (Part 2). In FIG. 5, the defective semiconductor chips 12 are indicated by "E". The defective semiconductor chips 12 will be concentrated on the central part of the semiconductor wafer 10 because the charge-up in plasma etching damages the gate insulation film. Such defect manner is called here the defect mode B. When the defect mode B takes place, many of the semiconductor chips 12 in the sampling region 14*g* are judged to be defective.

Figure 6:
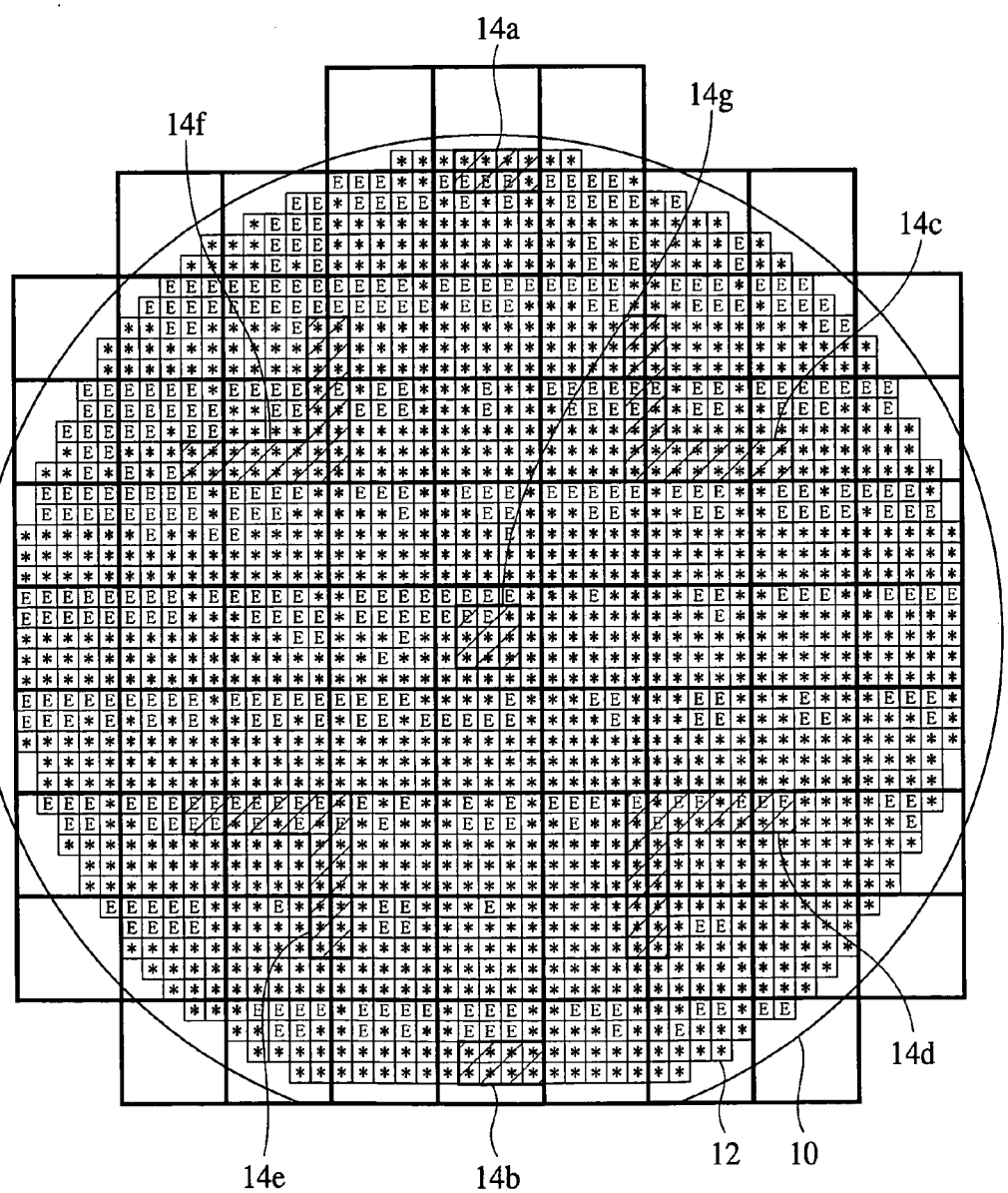
FIG. 6 is a plan view of a distribution of defects of the semiconductor chips (Part 3).

As illustrated in FIG. 6, when the exposure with the reticles is imperfect, defects of the semiconductor chips 12 take place outstandingly at the edges of the 1-shot exposure area of the exposure with the reticles. FIG. 6 is a plan view of a distribution of defects of semiconductor chips (Part 3). In FIG. 6, the defective semiconductor chips 12 are indicated by "E". Such defect manner is called here the defect mode C. The L-shaped sampling regions 14c–14f are arranged, containing the regions where the patterns of the semiconductor chips positioned at the edges of the reticles, and when the defect mode C takes place, some of the semiconductor chips 12 present in the sampling regions 14c–14f are judged defective.

The photoresist film to be used in patterning is formed by spin coating, and the film thickness of the photoresist film is larger at the peripheral part of the semiconductor wafer 10 than at the central part of the semiconductor wafer 10. Accordingly, at the edge of the semiconductor wafer 10, defects due to the photoresist film being thicker at the edge of the semiconductor wafer tend to take place. Such defect mode is called here the defect mode D. When the defect mode D takes place, some of the semiconductor chips 12 present in the sampling regions 14a, 14b are judged defective.

Figure 7:
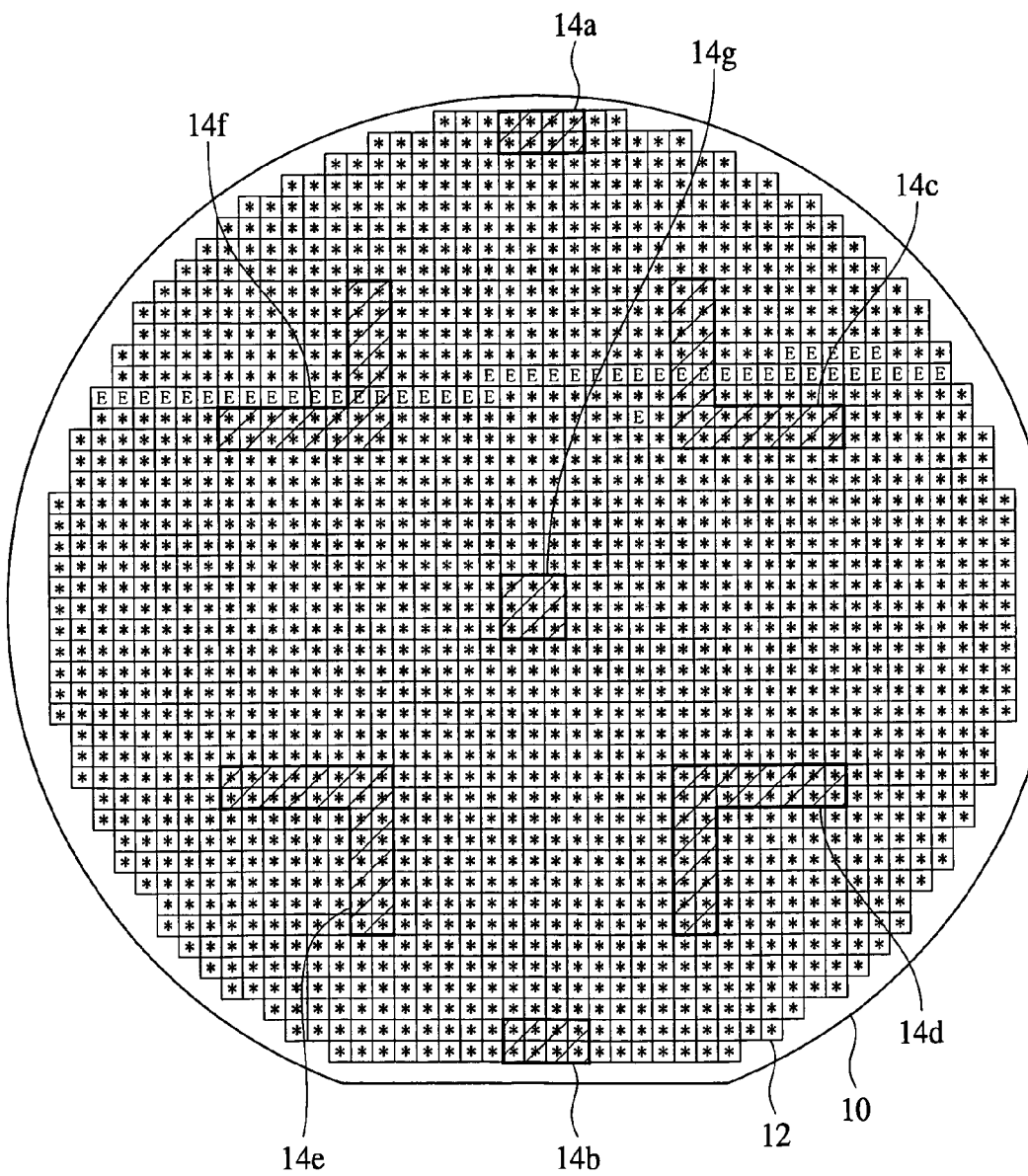
FIG. 7 is a plan view of a distribution of defects of the semiconductor chips (Part 4).

As illustrated in FIG. 7, there is a case that defects take place in a band-shape with respect to the semiconductor wafer 10. In FIG. 7, the defective semiconductor chips 12 are indicated by "E". FIG. 7 is a plan view of a distribution of defects of semiconductor chips (Part 4). Such defect manner is called here the defect mode E. In the defect mode E, some of the semiconductor chips 12 present mainly in the sampling regions 14c–14f are judged defective.

The sampling regions 12a–12g are arranged in regions where defects of semiconductor chips 12 tend to outstandingly take place due to imperfect fabrication processing. When the yield of the semiconductor chips 12 present in the sampling regions 14a–14g is relatively high, the rest semiconductor chips 12 can be judged to have been fabricated with high yield, because the sampling regions 14a–14g are positioned at parts where defects of semiconductor chips 12 tend to outstandingly take place.

Figure 8:
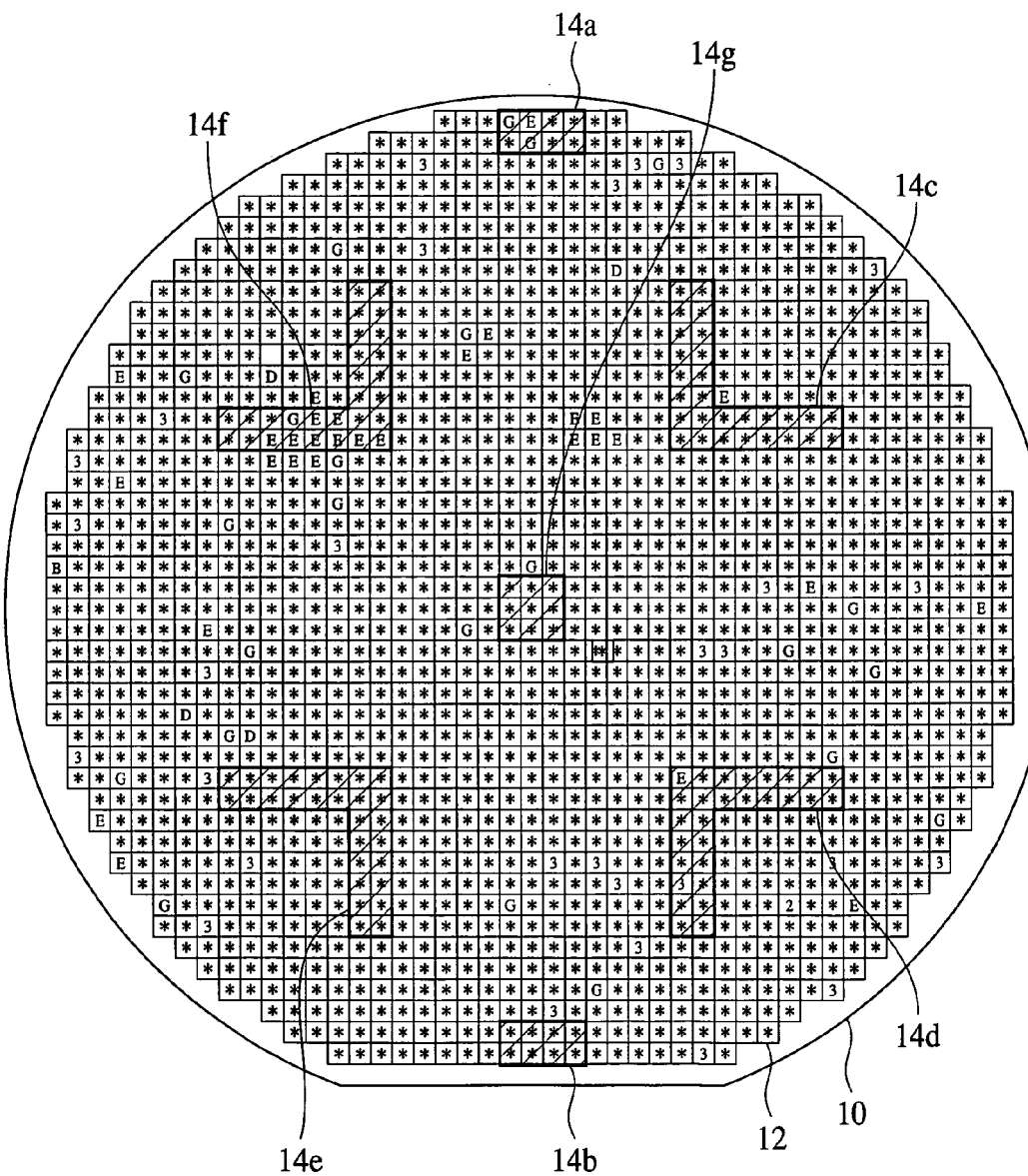
FIG. 8 is a plan view of a distribution of defects of the semiconductor chips (Part 5).

Defects of semiconductor chips are not always due to one defect mode alone. FIG. 8 is a plan view of a distribution of defects of semiconductor chips (Part 5). In FIG. 8, "2", "3", "D", "E" and "G" indicate categories of the defects.

Then, the yield of the semiconductor chips 12 present in the sampling regions 14a–14g are computed, and it is judged whether or not a completed yield is above or below a reference value (Step S5). The reference value is, e.g., (m−2σ). m is an average value of a plurality of yields of a plurality of semiconductor chips 12 fabricated in sampling regions 14 of a plurality of semiconductor wafers 10. σ is a standard deviation of the yields of the semiconductor chips 12 fabricated in the sampling region 14. When a value of (m−2σ) is relatively small, a suitable reference value may be set.

The reference value (m−2σ) is based on a rule of thumb as the index of skill of the fabrication line and an achievement (a trend of yields of 50 or more lots of the same form). When the value of (m−2σ) is, e.g., 90% or more, sudden abnormal lots are extremely decreased, and the effect of the present invention is conspicuous.

When the value of m is, e.g., 95.7%, and the value of 2σ is, e.g., 2.76%, the value of (m−2σ) is 92.9%. It cannot be said that the value of (m−2σ) in this case is high, and there will be a risk that in the final test this may result in the yield drop. That is, when the value of (m−2σ) is less than a prescribed value excluding the prescribed value, there is a risk that this may result in the yield drop in the final test. Accordingly, in this case, the prescribed value is the reference value. The prescribed value is, e.g., 95%.

When the value of m is, e.g., 98%, and the value of 2σ is, e.g., 1%, the value of (m−2σ) is 97%. It can be said that the value of (m−2σ) in this case is sufficiently high, and the possibility that this will result in the yield drop in the final test will be very low. That is, the value of (m−2σ) is above the prescribed value, and the possibility that this will result in the yield drop in the final test will be very low. Accordingly, in this case, the reference value is set at (m−2σ).

When the yield of the semiconductor chips 12 present in the sampling regions 14a–14g are the reference value or above, the probe test is not made on the semiconductor wafers 10 formed in the same lot and given numbers 2 to 10 (Step S6). This is because the yield in the sampling regions 14a–14g, where defects of the semiconductor chips 12 are conspicuous, are so high that the semiconductor chips 12 on the other semiconductor wafers 10 fabricated in the same lot are considered to have been fabricated with very high yield.

When the yield of the semiconductor chips 12 present in the sampling regions 14a–14g are below the reference value, the probe test is made on all the semiconductor chips 12 fabricated on the semiconductor wafers 10, and the probe test is made on all the semiconductor chips 12 fabricated on the semiconductor wafers 10 formed in the same lot and given wafer numbers 2 to 9. This is because when the yield of the semiconductor chips 12 in the sampling regions 14a–14g is below the reference value excluding the reference value, one of the defect modes A to E described above is considered to have taken place.

Then, the semiconductor wafer 10 given the wafer number 11 is sampled for the inspection (Step S4).

Then, it is judged whether or not the yield of the semiconductor chips 12 present in the sampling regions 14a–14g are the reference value or above (Step S5). When the yield of the semiconductor chips 12 in the sampling regions 14a–14g are the reference value or above, as described above, the probe test is not made on the semiconductor wafers 10 fabricated in the same lot and given wafers numbers 12 to 20 (Step S6).

When the yield of the semiconductor chips 12 present in the sampling regions 14a–14g are below the reference value excluding the reference value, the probe test is made on all the semiconductor chips 12 fabricated on the semiconductor wafer 10 given the wafer number 11. The probe test is made also on the semiconductor chips 12 fabricated in the same lot and given the wafer numbers 12 to 20 (Step S7).

Then, the semiconductor wafer 10 given the wafer number, e.g., 21 is sampled for the inspection (Step S4).

Then, it is judged whether or not the yield of the semiconductor chips 12 present in the sampling regions 14a–14g are the reference value or above (Step S5). When the yield of the semiconductor chips present in the sampling regions 14a–14g are the reference value or above, as described above, the probe test is not made on the semiconductor wafers 10 given the wafer numbers 22 to 30 (Step S6).

When the yield of the semiconductor chips 12 present in the sampling regions 14a–14g are below the reference value excluding the reference value, the probe test is made on all the semiconductor chips 12 fabricated on the semiconductor wafer 10 given the wafer number 21. The probe test is made also on all the semiconductor chips 12 formed on the semiconductor wafers 10 fabricated in the same lot and given the wafer numbers 22 to 30 (Step S7).

Next, the semiconductor wafer 10 given the wafer number, e.g., 31 is sampled of the inspection (Step S4).

Then, it is judged whether or not the yield of the semiconductor chips 12 present in the sampling regions 14a–14g are the reference value or above (Step S5). When the yield of the semiconductor chips 12 present in the sampling regions 14a–14g are the reference value or above, as described above, the probe test is not made on the semiconductor wafer fabricated in the same lot and given wafer numbers 32–40 (Step S6).

When the yield of the semiconductor chips 12 present in the sampling regions 14a–14g are below the reference value excluding the reference value, the probe test is made on all the semiconductor chips 12 fabricated on the semiconductor wafers 10 given the wafer number 31. The probe test is made also on all the semiconductor chips 12 fabricated on the semiconductor wafer 10 fabricated in the same lot and given the wafer numbers 32 to 40 (Step S7).

Next, the semiconductor wafer 10 given the wafer number, e.g., 41 is sampled for the inspection (Step S4).

Then, it is judged whether or not the yield of the semiconductor chips 12 present in the sampling regions 14a–14g are the reference value or above (Step S5). When the yield of the semiconductor chips 12 present in the sampling regions 14a–14g are the reference value or above, as described above, the probe test is made on the semiconductor wafers fabricated in the same lot and given the wafer numbers 42 to 48 (Step S6).

When the yield of the semiconductor chips 12 present in the sampling regions 14a–14g are below the reference value excluding the reference value, the probe test is made all the semiconductor chips 12 fabricated on the semiconductor wafer 10 given the wafer number 41. The probe test is made on all the semiconductor chips 12 fabricated on the semiconductor wafers 10 fabricated in the same lot and given the wafer numbers 42 to 48 (Step S7).

The probe test is made on all the semiconductor chips 12 fabricated on those of the semiconductor wafers 10, numbers of particles adhering on the surfaces of which are larger than a reference value (Step S7)

Thus, the probe test is completed.

(Evaluation Result)

Next, the result of the evaluation of the semiconductor device fabrication method according to the present embodiment will be explained.

The semiconductor device fabrication method according to the present embodiment was applied to a semiconductor device including the semiconductor chips 12 having a 95.7% average yield value m and a standard deviation σ of 1.135% (2σ=2.27%). The size of the semiconductor wafer 10 was eight inches.

The inspection period of time could be shortened to about ¹⁄₄₀ to ¹⁄₆₀ of the conventional inspection period of time.

No yield drop was found in the final test.

Based on the above, it is seen that the present embodiment can prevent the yield drop in the final test while the inspection efficiency can be improved.

The semiconductor device fabrication method according to the present embodiment is characterized mainly in that the probe test is made on the semiconductor chips 12 present in a prescribe sampling region 14, and when the yield of the semiconductor chips 12 present in the prescribed sampling region 14 is a reference value or above, the probe test is not made on the rest semiconductor chips 12 fabricated on the semiconductor wafer 10; and the probe test is not made on the semiconductor chips 12 fabricated on the rest semiconductor wafers 10.

According to the present embodiment, the sampling regions 14a–14g are positioned at parts where defects of the semiconductor chips 12 tend to take place, whereby the probe test is made on the semiconductor chips 12 present in the sampling regions 14a–14g to thereby judge whether or not the probe test must be made on the semiconductor chips 12 in the region other than in the sampling regions 14a–14g. Furthermore, the semiconductor fabrication method has very stable fabrication process, and can fabricate semiconductor devices of a very high average value of the fabrication yield and a very small standard deviation of the fabrication yields, whereby it can be judged whether or not the probe test must be made on the semiconductor chips 12 on the rest semiconductor wafers 10 fabricated in the same lot. Thus, the present embodiment can realize drastically improve the inspection efficiency and resultantly can realize low cost of semiconductor devices.

(A Modification)

Figure 9:
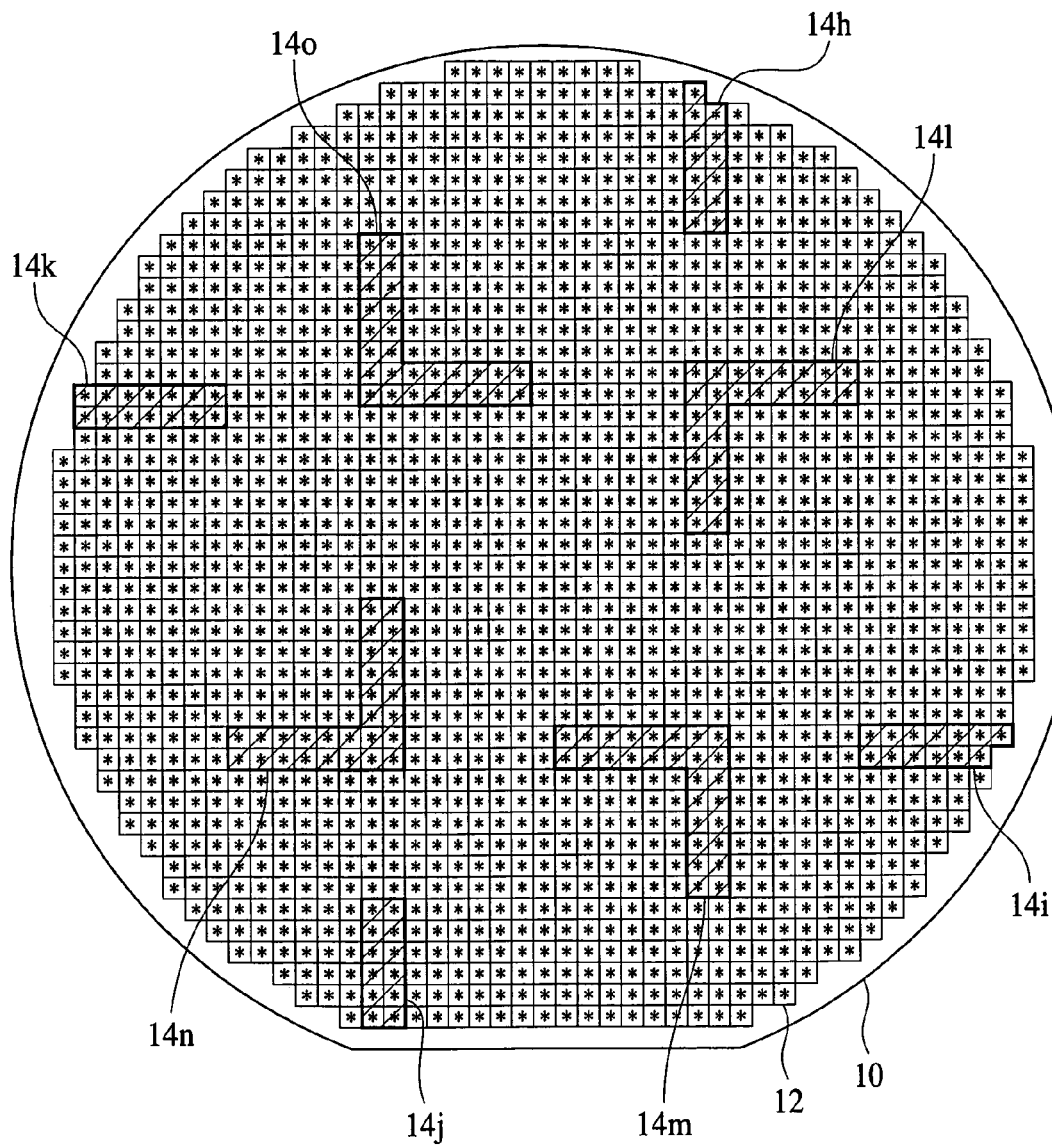
FIG. 9 is a plan view of a sampling region in the semiconductor device fabrication method according to one modification of said one embodiment of the present invention.

Next, the semiconductor device fabrication method according to a modification of the present embodiment will be explained with reference to FIG. 9. FIG. 9 is a plan view of a sampling region in the semiconductor device fabrication method according to the present modification.

As illustrated in FIG. 9, the sampling region of the present modification contains first sampling regions 14h–14k which are at the peripheral part of the semiconductor wafer 10, and second sampling regions 14l to 14o which are in the region between the central part and the peripheral part of the semiconductor wafer 10.

The sampling regions 14h, 14l are positioned in the first quadrant of the semiconductor wafer 10, and the sampling regions 14i, 14m are positioned in the second quadrant of the semiconductor wafer 10. The sampling regions 14j, 14n are positioned in the third quadrant of the semiconductor wafer 10. The sampling regions 14k, 14o are positioned in the fourth quadrant of the semiconductor wafer 10.

The sampling regions 14l–14o contain edges of 1-shot exposure regions of the exposure with a reticle.

When the gate insulation film is not easily damaged due to the charge-up in plasma etching, it is not necessary to define a sampling region at the central part of the semiconductor wafer 10, as is in the present modification. When there is a risk of the gate insulation film being damaged due to the charge-up, a sampling region may be defined further at the central part of the semiconductor wafer 10.

As described above, a sampling region 14 maybe set suitably at parts where defects of the semiconductor chips 12 tend to outstandingly take place.

[Modified Embodiments]

The present invention is not limited to the above-describe embodiment and can cover other various modification.

For example, in the above-described embodiment, when the yield of the semiconductor chips 12 in the sampling region 14 is the reference value (m−2σ) or above, the probe test is not made on the rest semiconductor chips 12. However, the reference value is not essentially (m−2σ) and can be suitably set at, e.g., (m−3σ).

In the above-described embodiment, when (m−2σ) is below 95% (prescribed value), the prescribed is the reference value. However, the prescribed value is not limited to 95% and can be set at, e.g., 95% or above.

In the above-described embodiment, the average value m of the yields of the semiconductor chips 12 in the sampling regions 14 of the semiconductor wafers 10 is 95% or above, but the average value m of the yields of the semiconductor chips 12 in the sampling region 14 of the semiconductor wafers 10 is not limited to 95% or above. However, when the average value m of the yields of the semiconductor chips 12 in the sampling regions 14 of the semiconductor wafers 10 is not relatively low, the possibility of defective semiconductor chiss being detected in the final test is higher, which contrarily leads to cost increase. Thus, for the cost decrease of semiconductor devices, it is advantageous that the average value m of the yields of the semiconductor chips 12 in the sampling region 14 is relatively high.

What is claimed is:

1. A semiconductor device fabrication method comprising;
   a first step of fabricating a plurality of semiconductor chips on a plurality of semiconductor wafers, respectively;
   a second step of making a probe test on said plurality of semiconductor chips respectively, which are present in a sampling region of one semiconductor wafer of said plurality of semiconductor wafers; and
   a third step of computing a yield of said plurality of semiconductor chips present in the sampling region,
   when the yield of said plurality of semiconductor chips computed in the third step are a reference value or above, the probe test being not made on said plurality of semiconductor chips, which are present outside the sampling region of said one semiconductor wafer and on the rest semiconductor wafers of said plurality of semiconductor wafers fabricated in the same lot as said one semiconductor wafer.

2. A semiconductor device fabrication method according to claim 1, wherein
   when an average value of a plurality of yields of a plurality of semiconductor chips in sampling regions of a plurality of semiconductor wafers is m, and a standard deviation of said plurality of yields of said plurality of semiconductor chips in the sampling regions of said plurality of semiconductor wafers is $\sigma$, a value of m$-2\sigma$ is the reference value when the value of m$-2\sigma$ is a first value or above, and when the value of m$-2\sigma$ is below the first value, the first value is the reference value.

3. A semiconductor device fabrication method according to claim 1, further comprising, after the first step and before the second step,
   a fourth step of detecting numbers of particles adhering to a surface of the said plurality of semiconductor wafers,
   when the number of particles adhering to the surface of the semiconductor wafer is a second value or above, the probe test is made on all the semiconductor chips fabricated on said semiconductor wafer.

4. A semiconductor device fabrication method according to claim 1, wherein
   the first step includes the step of using a reticle having patterns of said plurality of semiconductor chips to sequentially expose the patterns, and
   the sampling region contains a first partial region where the pattern of the semiconductor chip, which is positioned at an edge of the reticle, is exposed.

5. A semiconductor device fabrication method according to claim 2, wherein
   the first step includes the step of using a reticle having patterns of said plurality of semiconductor chips to sequentially expose the patterns, and
   the sampling region contains a first partial region where the pattern of the semiconductor chip, which is positioned at an edge of the reticle, is exposed.

6. A semiconductor device fabrication method according to claim 3, wherein
   the first step includes the step of using a reticle having patterns of said plurality of semiconductor chips to sequentially expose the patterns, and
   the sampling region contains a first partial region where the pattern of the semiconductor chip, which is positioned at an edge of the reticle, is exposed.

7. A semiconductor device fabrication method according to claim 4, wherein
   the first partial region is an L-shaped region which is positioned between a central part of said one semiconductor wafer and a peripheral part thereof.

8. A semiconductor device fabrication method according to claim 5, wherein
   the first partial region is an L-shaped region which is positioned between a central part of said one semiconductor wafer and a peripheral part thereof.

9. A semiconductor device fabrication method according to claim 6, wherein
   the first partial region is an L-shaped region which is positioned between a central part of said one semiconductor wafer and a peripheral part thereof.

10. A semiconductor device fabrication method according to claim 4, wherein
    the sampling region contains a second partial region which is positioned at a central part of said one semiconductor wafer.

11. A semiconductor device fabrication method according to claim 5, wherein
    the sampling region contains a second partial region which is positioned at a central part of said one semiconductor wafer.

12. A semiconductor device fabrication method according to claim 6, wherein
    the sampling region contains a second partial region which is positioned at a central part of said one semiconductor wafer.

13. A semiconductor device fabrication method according to claim 7, wherein
    the sampling region contains a second partial region which is positioned at a central part of said one semiconductor wafer.

14. A semiconductor device fabrication method according to claim 8, wherein
    the sampling region contains a second partial region which is positioned at a central part of said one semiconductor wafer.

15. A semiconductor device fabrication method according to claim 9, wherein
    the sampling region contains a second partial region which is positioned at a central part of said one semiconductor wafer.

16. A semiconductor device fabrication method according to claim 4, wherein
    the sampling region contains a third partial region which is positioned at a peripheral part of said one semiconductor wafer.

17. A semiconductor device fabrication method according to claim 5, wherein
    the sampling region contains a third partial region which is positioned at a peripheral part of said one semiconductor wafer.

18. A semiconductor device fabrication method according to claim 6, wherein
    the sampling region contains a third partial region which is positioned at a peripheral part of said one semiconductor wafer.

19. A semiconductor device fabrication method according to claim 7, wherein
    the sampling region contains a third partial region which is positioned at the peripheral part of said one semiconductor wafer.

20. A semiconductor device fabrication method according to claim 8, wherein
    the sampling region contains a third partial region which is positioned at the peripheral part of said one semiconductor wafer.

* * * * *